(12) United States Patent
Sanders et al.

(10) Patent No.: US 10,165,700 B1
(45) Date of Patent: Dec. 25, 2018

(54) HOST DEVICE AND ADD-ON MODULE ASSEMBLY WITH A RUGGED MODULE CONNECTION

(71) Applicant: TRIMBLE INC., Sunnyvale, CA (US)

(72) Inventors: Michael George Sanders, Christchurch (NZ); Steven N. Miller, Albany, OR (US); Gerald W. Steiger, Corvallis, OR (US); Gareth Todd Gibson, Christchurch (NZ); David A. Sheehan, Corvallis, OR (US); Robert Barnwell Elliott Puckette, Brush Prairie, WA (US); Geoffrey James Mentink, Christchurch (NZ)

(73) Assignee: TRIMBLE INC., Sunnyvale, CA (US)

( * ) Notice: Subject to any disclaimer, the term of this patent is extended or adjusted under 35 U.S.C. 154(b) by 0 days.

(21) Appl. No.: 15/837,082

(22) Filed: Dec. 11, 2017

(51) Int. Cl.
*G06F 1/16* (2006.01)
*H05K 7/14* (2006.01)

(52) U.S. Cl.
CPC ......... *H05K 7/1429* (2013.01); *G06F 1/1632* (2013.01); *G06F 1/1684* (2013.01); *H05K 7/1435* (2013.01)

(58) Field of Classification Search
CPC .............................. G06F 1/1632; G06F 1/1656
See application file for complete search history.

(56) References Cited

U.S. PATENT DOCUMENTS

| | | | | |
|---|---|---|---|---|
| 5,278,730 A * | 1/1994 | Kikinis | ................. | G06F 1/1626 361/679.32 |
| 6,115,242 A * | 9/2000 | Lambrecht | ................ | G06F 1/20 257/686 |
| 6,567,273 B1 * | 5/2003 | Liu | .................. | G06K 19/07732 361/737 |
| 2003/0214788 A1 * | 11/2003 | Bang-Heng | ............. | G06F 1/183 361/727 |
| 2004/0015626 A1 * | 1/2004 | Huang | ............. | G06K 19/07732 710/62 |
| 2004/0075977 A1 * | 4/2004 | Lee | ........................ | G06F 1/1616 361/679.4 |
| 2006/0098405 A1 * | 5/2006 | Bloebaum | ............ | G06K 19/077 361/679.37 |
| 2007/0177114 A1 * | 8/2007 | Shirakura | ............ | G03B 21/145 353/119 |
| 2007/0247803 A1 * | 10/2007 | Eickholdt | ............. | G06F 1/1616 361/679.38 |

* cited by examiner

*Primary Examiner* — Adrian S Wilson
(74) *Attorney, Agent, or Firm* — Marsh Fischmann & Breyfogle LLP; Kent A. Lembke

(57) ABSTRACT

An assembly including a host device and an add-on module, in which the host device and the add-on module include features to provide a rugged electro-mechanical interface or connection between the host device and the add-on module. The host device includes a body that has an open or non-enclosed docking bay on a side, and the module is placed into the docking bay such that a top side of its body mates with the inner surfaces and features of the docking bay. The interface is rugged so that the assembly is useful in the field, and the interface provides a secure attachment that can withstand dropping. A hook is provided on the top side of the body of the module, and the hook feature's shape, when combined with the location of fasteners on the module body that mate with threaded holes in the docking bay, is designed to withstand dropping.

33 Claims, 10 Drawing Sheets

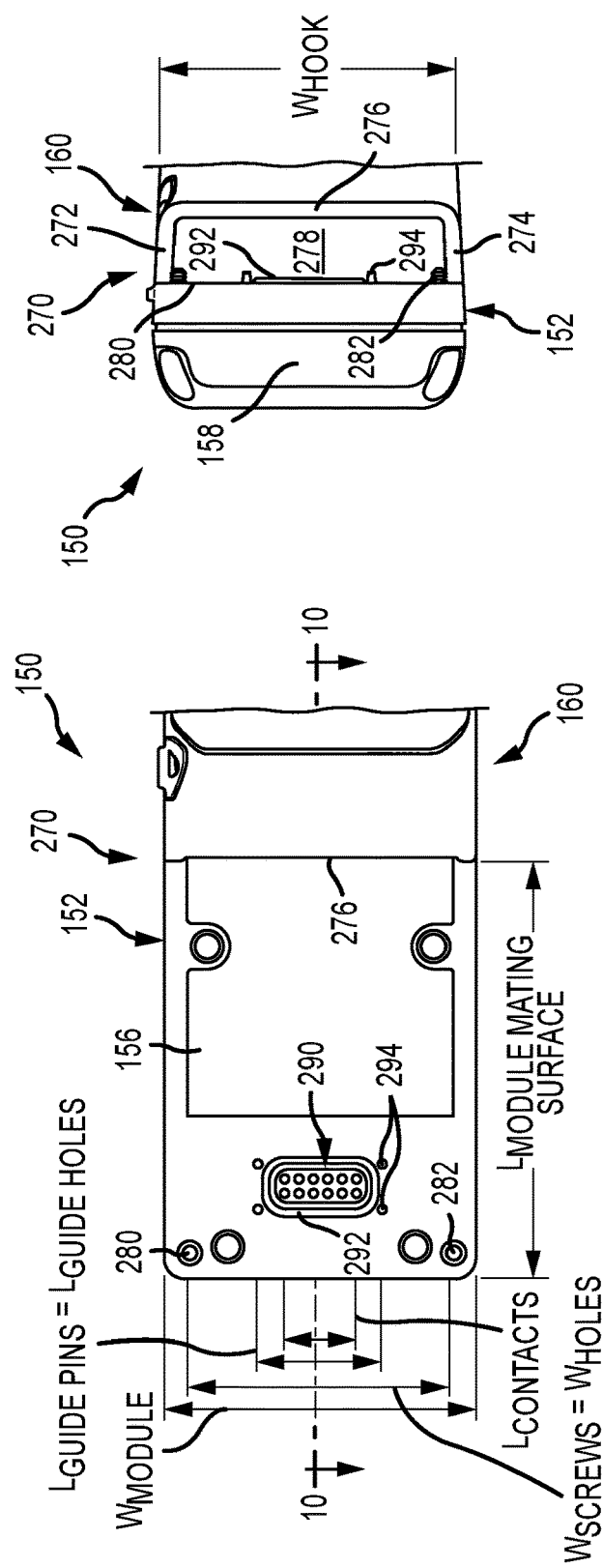

HOST DEVICE AND ADD-ON MODULE ASSEMBLY WITH A RUGGED MODULE CONNECTION

BACKGROUND

1. Field of the Invention

The present description generally relates to portable computers and electronic devices ("host devices" or "host computing devices") such as computing devices in the form of laptops, notebooks, tablets, pads, and the like and wireless communication devices such as smartphones and the like. More particularly, the present description relates to a new design of an assembly of a host device and an add-on module (or modular accessory or smart module or the like) to provide an interface or connection (i.e., a module-to-host interface or connection) that is rugged so as to support field use of the assembly.

2. Relevant Background

In recent years, advances in data processing, display technologies, and wireless communications have led to a rapid expansion of mobile computing. Today, nearly everyone carries with them one or more handheld or portable computing or communications device in the form of an electronic reading device, a smartphone, a laptop, a notebook, a pad, a tablet, or other computing device.

Typically, these portable computing/communication devices are designed to perform a specific set of functions. New features or functions may be added by coupling another device onto the portable computing device. In such assemblies, the portable computing or communications device may be thought of as the "host device" (or "host computing device") and the device that is coupled to the host device may be thought of as an "add-on module" (or "modular accessory"). The add-on module may include hardware and software to provide additional features/functions. For example, the add-on module may be a smart module or device that includes software or applications that can be run by the processor of the host device or by a processor on the add-on module itself. Some add-on modules have been designed to facilitate communications or data collection by the host device and may include a radio transceiver and/or a communications or positioning antenna (e.g., to provide a positioning technology such as GNSS, GPS, or the like). The add-on module may be configured to provide a specific function such as laser scanning (e.g., a laser range finder), barcode scanning, presenting data/video (e.g., a projector with associated software), and the like. Some add-on modules include batteries to supply power to the components of the module, and these batteries can be charged through the module interface.

While add-on modules provide many advantages over use of a standalone host device, prior designs of the connection or coupling interface between the host device and add-on module have not fully met the demands of the host device users or of the mobile computing industry. In general, the connection has been configured to allow the add-on module to be easily connected to the host device and then later removed so as to allow different add-on modules and the features/functions they provide to be used with the host device. With these design goals in mind, many connection designs simply call for the add-on module to have a set of pins (e.g., communication and/or power connection pins) or other components that allow the add-on module to be plugged into a corresponding port or receptacle on a side or edge of the host device's body. In other cases, the connection is formed using a set of screws (e.g., four screws provided on the add-on module that mate with four threaded holes on the body of the host device).

While useful in some cases, the existing module-to-host connection designs are not rugged enough to support field use of the host and module assembly. For example, it is desirable for the connection to be configured to resist (if not prevent) damage to either the host device or the add-on module when the assembly is dropped (e.g., from a height in the range of 3 to 10 feet or the like) onto a hard surface (such as a road or sidewalk). With conventional connection designs, extreme stress is placed upon the add-on module or the connection points/elements when the assembly lands upon or near the add-on module. The stresses and/or forces upon impact may result in the connection being interrupted and, in many cases, damage to the add-on module or host device such as by shearing off one or more of the screws (or stripping the threaded hole on the host device body).

Hence, there remains a need for an improved design of the interface or connection between a host device and add-on modules. Preferably, the new design will provide a rugged connection that allows the host device and module assembly to be used in the field with less risk of damage. Also, it is desirable for the connection design to be relatively inexpensive to manufacture and to be easy to implement including in the field (e.g., require few tools).

SUMMARY

An assembly that includes a host device and at least one add-on module (or modular accessory) is described herein. The host device and the add-on module are specifically designed to include a number of features to provide a rugged electro-mechanical interface or connection between the host device and the add-on module, and this interface/connection facilitates attaching modules to and removing modules from handheld, tablet, and other portable computing or communication devices ("host devices"). The interface includes mechanical and electrical features, with a first set provided on the host device and a second set provided on the add-on module (e.g., design of both devices combined creates the interface/connection).

In brief, the host device includes a body that has an open or non-enclosed docking bay on one side (e.g., the lower or bottom side opposite the host's devices display and/or touchscreen), and the module is placed into the docking bay such that a first side (e.g., top side) of its body mates with the inner surfaces and/or features of the docking bay. The interface/connection is designed to be rugged and make the assembly useful in the field, and, in some embodiments, the interface/connection is configured to provide a secure attachment that can withstand particular drop testing requirements (e.g., the requirements stated in MIL-STD 810G or the like).

Particularly, a hook (or hook element) is provided on the first or top side of the body of the module, and the hook features' shapes when combined with the location of one or more fasteners (e.g., screws) on the module body that mate with threaded receptacles/holes in the docking bay are designed to provide a rugged connection/interface built to withstand the following vibration and shock requirements: (1) MIL-STD-810G w/change 1 Method 514.7 Procedure I, II, III—Vibration Testing; and (2) MIL-STD-810G w/change 1 Method 516.7 Procedure IV—Shock Testing. By providing a design that meets these requirements, the interface/connection can readily be classified as "rugged," and this is achieved in part by passing most of the load through the host device's body rather than on the add-on module or the fasteners used to attach the module to the host device (as was the case with many prior designs where screws could fail during drop tests).

Further, the module's body (e.g., the top or first side mating with the docking bay) includes alignment features to allow accurate alignment of the electrical interface between the host device and the add-on module. The electrical pinout is a unique layout that includes a signal/power interface (e.g., one that complies with a standard such as USB 3.0 or the like), general purpose input/output (I/O) lines, and a pin/lines for providing an attachment detection signal.

More particularly, an assembly is described that is adapt to provide a rugged interface between a host device and an add-on module. The assembly includes a host device with a host device body with a side including a docking bay. The docking bay includes a receiving surface that is recessed a distance from the side of the host device body to define a depth of the docking bay, and the host device includes a hook mating feature (or a tab) with a body protruding outward from the docking bay (such as from one end of the receiving surface (e.g., outward from a sidewall extending downward into the module body at the outer end of the receiving surface)).

The assembly also includes an add-on module that has a module body with a top side and a bottom side, and the module body is positionable within the docking bay with the top side of the module body abutting the receiving surface of the docking bay. The module body includes a hook extending upward from an end of the top side, and the hook is adapted to receive the body of the hook mating feature when the module body is positioned within the docking bay to block rotation of the module body out of the docking bay. The module body has a height as measured between the top side to the bottom side, and the depth of the docking bay is at least one fourth of the height of the module body (and, in some embodiments, more than about one half of the height of the module body), whereby side loads/forces are passed through the module body to the surrounding portions of the host device body.

In some embodiments, the module body further includes at least one fastener with a threaded end extending outward from the top side of the module body. In such embodiments, the at least one fastener may be provided in a first end of the module body, which is opposite a second end of the module body containing the hook. The receiving surface of the docking bay then may include one or more threaded holes for receiving the threaded end of the at least one fastener when the module body is positioned within the docking bay. Further, the docking bay may include an inner sidewall extending from the side of the host device body to the receiving surface, and the receiving surface is disposed between the inner sidewall and the hook mating feature. In such embodiments, the module body may include two fasteners and the receiving surface two threaded holes for receiving the threaded ends of the fasteners when the module body is positioned within the docking bay with the first end of the module body proximate to the inner sidewall of the docking bay.

In the same or other embodiments, the hook may include left and right spaced-apart sidewalls extending outward from the top side of the module body. The hook may also include an upper sidewall extending between the left and right spaced-apart sidewalls. A void space is defined by inner surfaces of the left and right spaced-apart sidewalls and the lower sidewall, and the body of the hook mating feature (or the "tab") is received within the void space with a hook-mating surface of the body abutting the upper sidewall when the module body is positioned within the docking bay to form the rugged interface. In other implementations, the hook includes an upper sidewall spaced apart and extending outward from an end of the module body parallel to and toward the top side, and a hook-mating surface of the body abuts the upper sidewall when the module body is positioned within the docking bay to form the rugged interface.

In some embodiments, a communication interface is formed when the module body is positioned within the docking bay via coupling of a set of connection pins on the top side of the module body with a set of contacts on the receiving surface of the docking bay. A pinout design for the communication interface may include data communication lines and a power supply line for supplying power from the host device to the add-on module. The set of connection pins may be provided using a set of pogo pins in some cases. The data communication lines may be configured to provide a Universal Serial Bus (USB) connection between the add-on module and the host device. The pinout design may also include a module detection signal allowing the host device to detect the add-on module in the docking bay and/or also include at least one shared communication line connected between the add-on module, any additional add-on modules in additional docking bays on the host device body, and the host device for accessory control or low latency communications.

BRIEF DESCRIPTION OF THE DRAWINGS

FIG. 8 is a top view of a modular accessory (or add-on module), adapted for mating with the host device of FIG. 5, showing in greater detail interface/connection elements on the top side of the modular accessory body;

FIG. 9 is an end view of the modular accessory of FIG. 8 providing further detail of the mating hook.

DETAILED DESCRIPTION

In brief, the following describes a new design for an electro-mechanical connection or interface for coupling one or more add-on modules (or modular accessories) to a host computing device (or host device). The following description presents the new interface/connection in the context of an exemplary embodiment of an assembly of a host device and add-on module, which are each adapted to include a number of the components or elements of the new interface/connection.

The new interface/connection is very easy to use to attach the add-on module to the host device and to later remove it. The interface/connection is also rugged so as to facilitate field use of the assembly, with most of the load and corresponding stresses associated with dropping the assembly (or other similar impacts/collisions) being passed through the host device body rather than fasteners coupling the add-on module to the host device. The body of the add-on module is received within a recessed docking bay provided on the body of the host device, and the mechanical connection uses the sides of the docking bay that abut the outer sides of the add-on module body to restrain lateral movement of the add-on module and to pass related lateral forces/stresses (i.e., side loads) into the host device body.

Further, the mechanical connection uses one or more fasteners (e.g., one or two screws) at a first end of the add-on module body to fasten the add-on module to the host device body, and also what is labeled a "hook" herein that is provided on the add-on module body to couple with a lip of a tab or protruding element in the docking bay on the host device body. The hook removes the need for extra screws as it is mated with the tab on the host device body to prevent vertical or lifting movement of the end of the add-on module opposite the end attached with the fasteners. When coupled together, a set of pins on the add-on module mate with a set of contacts on the host device body in the docking bay, and the pinout arrangement is unique to the interface/connection described herein as is the use of pogo pins (i.e., spring-loaded pins) for each of the contact pins on the add-on module.

Figure 1:
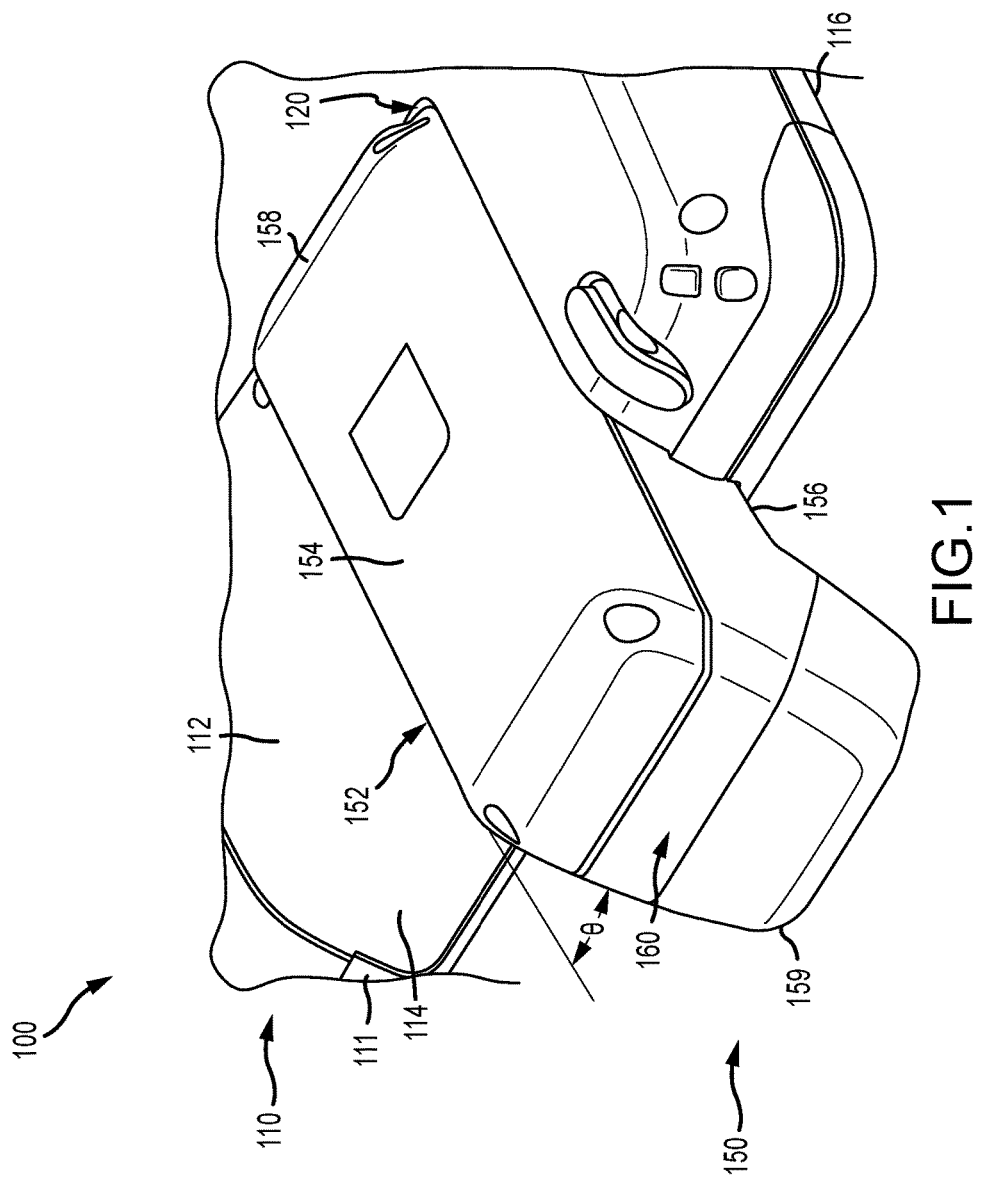
FIG. 1 is a partial perspective view of an assembly of a host computing device and a modular accessory (or add-on module) according to one embodiment of the present description.

FIG. 1 is a partial perspective view of an assembly 100 that includes of a host computing device (or, simply, a host device) 110 and a modular accessory (or add-on module) 150 according to one embodiment of the present description. The host device 110 includes a body 111 (shown in part for simplicity of illustration) that may be generally planar in shape and have a back side (or first side) 112 and a front side (or second side) 116 spaced apart by an edge or outer sidewall 114. The host device 110 may take a wide variety of forms to practice the assembly 100 such as a portable computing device (e.g., a laptop, a notebook, a pad, a tablet, an e-reader, a gaming device, and the like) and/or a wireless communication device (e.g., a smartphone). The front side 116 often will include I/O devices such as a touchscreen or the like.

The back side 112 of the host device body 111 includes a recessed surface or docking bay 120 in which the add-on module 150 can be received (as shown). As will be explained in detail below, the add-on module 150 and host device body 111 are configured to each include subsets of components/elements that together provide a rugged connection (or interface) between the host device 110 and the add-on module 150. The rugged connection allows the add-on module 150 to be physically attached or affixed (in a stationary and rigid manner) to the host device body 111 when the add-on module 150 is positioned in the docking bay 120 and also to provide electrical and/or communication coupling through a set of contacts on the host device 110 and a set of pins on the add-on module 150.

The add-on module 150 includes a body 152 to encase and house software and/or hardware to allow it to provide "add-on" or additional functions and features for the host device 110. For example, the add-on module 150 may include an antenna and/or transceivers to enhance (or to provide) communications and/or localization capabilities of the host device 110 while other embodiments may include software, memory, and/or processors, may include laser scanning components, or may include a battery. As shown, the add-on module's body 152 includes a bottom side (or second side) 154 and a top side (or first side) 156, and the body 152 is positioned in the assembly 100 with the top side 156 facing the bottom side 112 of the host device body 111 and is inserted into and placed in abutting contact with the docking bay 120. The body 152 also extends from a first or inner end 158 to a second or outer end 159, and the first/inner end 158 is placed near (e.g., within 5 millimeters or the like with less than 1 millimeter used in some cases) or even in abutting contact with an end wall/inner sidewall of the docking bay 120.

The body 152 may include an extension or protruding portion 160 proximate to or at the second or outer end 159 (distal to the first or inner end 158), and this protruding portion 160 may house/contain elements or components of the add-on module 150 that have their functionality enhanced or improved by having a particular physical orientation relative to the body 111 of the host device 110 (at least during its use). For example, the protruding portion 160 may extend some distance outward from the edge 114 of the host device body 111 when the add-on module 150 is inserted into and mated with the docking bay 120, and the protruding portion 160 may wholly or partially house an antenna. To facilitate operations of the contained antenna, the protruding portion 160 may be angled away from the rest of the add-on body 152 (e.g., away from bottom and top sides 154 and 156 of the body 152, which may be planar and parallel to each other as shown) at an angle, θ. The angle, θ, may be in the range of 20 to 60 degrees (as measured from one or both sides 154, 156), with 25 to 35 (e.g., 30) degrees being useful in one embodiment, and the angled orienting of the protruding portion 160 can be used to direct the antenna in a particular direction during use of the host device 110 such as generally toward the sky or upward (with the front side 116 facing user and the edge 114 being the top edge of the host device 110). In some cases, the module body 152 may be designed for a particular docking bay 120 such that the protruding portion 160 does not extend over some predefined distance from the edge 114 of the host device body 111 to limit shear or other forces when the assembly 100 is dropped (e.g., less than about 100 millimeters (and more preferably less than 50 millimeters) of overhang length or the like may be a general design guidance).

Figure 2:
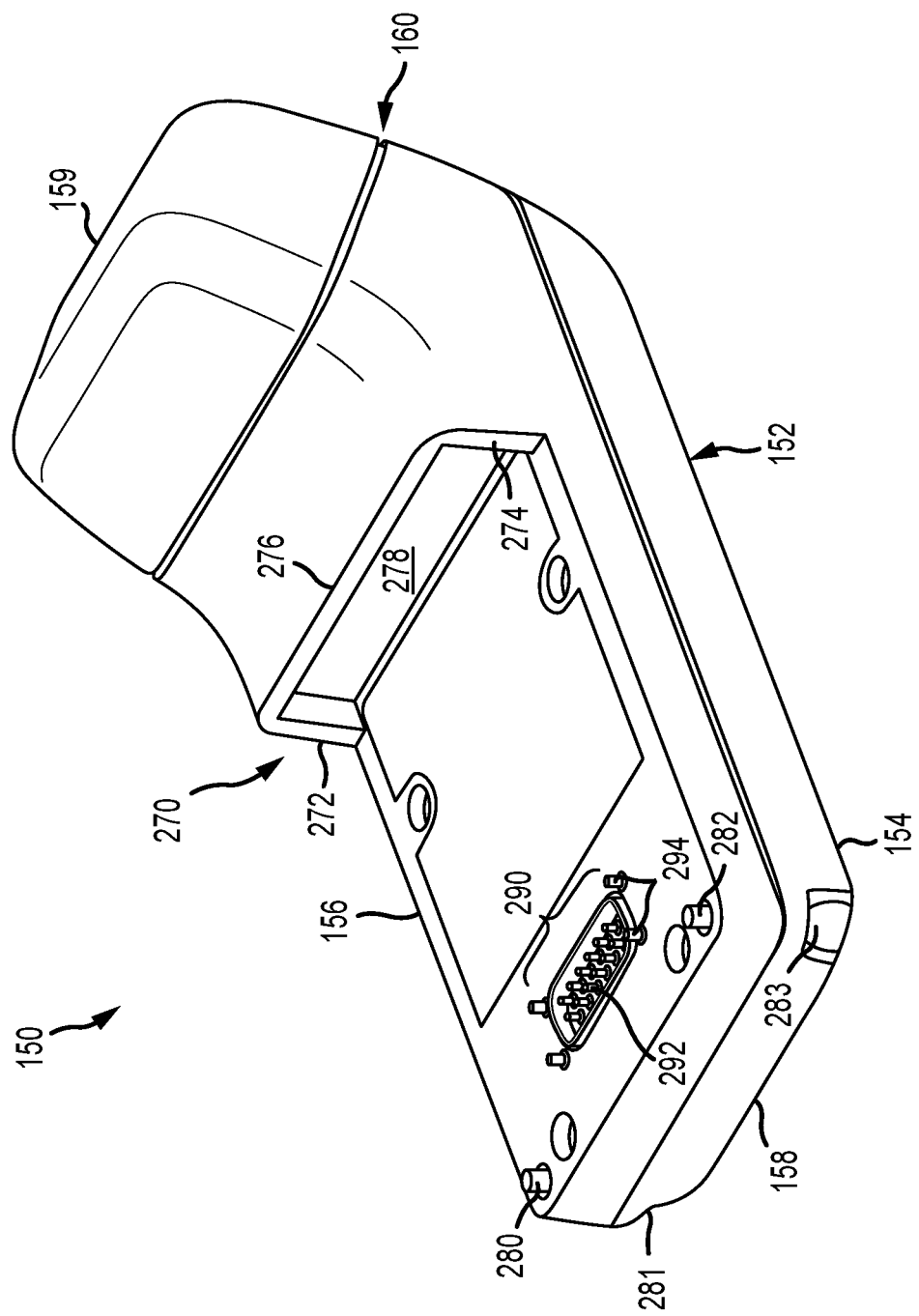
FIG. 2 is a perspective view of the modular accessory of the assembly of FIG. 1 showing the top or host-mating side of the modular accessory and interface/connection components provided on the body of the modular accessory.

FIG. 2 is a perspective view of the add-on module 150 of the assembly of FIG. 1 showing the top or host-mating side 156 of the body 152 and interface/connection components provided on the body 152 of the add-on module 150. As discussed with reference to FIG. 1, the top side 156 of the add-on module body 152 is positioned toward or facing into the docking bay 120 of the host device body 111 to form the assembly 100 (and typically will be planar), and the first or inner end 158 is inserted into the docking bay 120 as a leading edge or as the part of the top side 156 that is abutting or proximate to an inner sidewall or end wall of the docking bay 120.

Significantly, the connection/interface elements on the add-on module body 152 include a module hook (or hook assembly) 270 that is designed to provide fastener-free, physical engagement of the module body 152 with a corresponding component on the host device body 111 (a tab or tongue on the edge 114) in the docking bay 120. The module hook 270 is configured to limit or even prevent the top side 156 from being lifted away from or upward from the host device body 111 once the module 150 is positioned within the docking bay 120 and fastened onto the host device body 111. As shown, the module hook 270 includes left and right sidewalls 272 and 274 that are spaced apart (about the entire width of the module body 152 as they typically extend vertically upward from the top side 156 at left and right sides/edges, respectfully, of the body 152) and are parallel to each other.

In the hook 270, an upper sidewall or host-mating ledge (or hook member) 276 extends between the two sidewalls 272, 274, and the upper sidewall 276 is spaced apart a distance from the top side 156 chosen so as to allow a tab/tongue on the host device 110 to be received between the upper sidewall 276 and the top side 156. The hook 270 is further defined by a recessed backwall or backstop 278 (which may be considered a part of the inner wall of the protruding portion 160), which may be integrally formed with inner sides or edges of the walls 272, 274, 276 and defines with the walls 272, 274, 276 a recessed space for receiving the host device tab/tongue (e.g., a rectangular space when the tab/tongue is generally rectangular with dimensions corresponding to the outer dimensions of the tab/tongue). The hook member or upper sidewall 276 does not need to extend the full width of the body 152 in all embodiments, with some implementations using a hook member 276 that is centrally positioned between the sidewalls 272, 274 and having a length less than the width of body 152 (while other embodiments use two, three, or more spaced apart hook members in place of the single hook member 276 (e.g., the hook member 276 may be broken up into two or more pieces to serve a similar function)).

The connection or interface is further achieved by providing one or more fasteners extending outward from the top side 156. As shown, first and second fasteners (e.g., screws) 280, 282 are provided on the add-on module 152 at a predefined distance from the hook 270 such as at or near the first or inner end 158 of the module body 152. The two fasteners 280, 282 extend outward from the side 156 such as to expose a number of threads in the screw embodiments or so as to otherwise mechanically couple/fasten the module body 152 to the host device body 111 within the docking bay 120. The fasteners 280, 282 are shown to be spaced apart near the edges of the body 152 so as to better retain the body 152 in the bay 120 (with relatively equal loads on each fastener 280, 282), but an embodiment with one fastener may position that fastener at or near the center of the body 152 along the end 158. A tool access passageway 281, 283 is provided in the bottom side 154 of the body 152 opposite the top side and protruding threads (or other portions of the fasteners 280, 282), e.g., a recessed surface or cylindrical tunnel is provided to allow a screwdriver or the like to access the heads of screws 280, 282 to rotate the screws 280, 282 to tighten the screws and fasten the body 152 within the bay 120.

The electro-mechanical connection/interface is further achieved by providing a set of connection pins 290 that are exposed on the top side 156 of the module body 152. The location of the set of connection pins 290 is not limiting as long as they are accurately positioned for mating with a corresponding set of contacts in the docking bay 120 of the host device body 111 and can be properly aligned when the module body 152 is inserted into the docking bay 120. To this end, the connection/interface may include a number of alignment posts or pins 294 extending upward from the top side 156 that can be received within alignment holes in the docking bay 120 when the module body 152 is received within that bay 120.

As shown, a set of four alignment posts 294 are provided and positioned about the periphery of the set of connection pins 290 such as at each corner of the set 290 with the set 290 arranged in two rows (or columns) in a rectangular pattern. The height of the posts 294 may be relatively small as the posts 294 only serve to align the pins 290 and are not used for structural loading (with one embodiment using posts that are less than about 5 millimeters and some amount less than the depth of the alignment holes in the docking bay 120). In some preferred embodiments, each pin in the set of pins 290 is a pogo (or spring-loaded) pin to facilitate better electrical connections with contacts on the surface of the docking bay 120. Further, the specific pinout (or types of connections/lines) provided with the set of pins 290 (when combined with the contacts of the host device 110) is unique to the connection/interface described herein and is explained in further detail below. A sealing element 292 is provided on the side 156 and extends (in a continuous manner) about the periphery of the set of pins 290 (between the pins 290 and the alignment posts 294) that acts to prevent liquid from traveling along the side 156 and reaching the pins 290 (which may result in a short circuit). The sealing element 292 may be formed of a resilient and/or compressible material to facilitate sealing such as of a rubber or softer plastic as is common for gasket, rings, and other sealing components.

As discussed above, the add-on module 150 and docking bay 120 of the host device 110 each include a subset of the features/elements useful for achieving the rugged connection/interface between the module 150 and the host device 110. The hook feature 270 on the module body 152 is placed onto a corresponding feature in the docking bay 120 when the add-on module 150 is attached to the host device 110. It is important to note that the hook 270 holds the two halves of the host device body 111 together without unduly stressing one half of the host device body 111 when the assembly 100 is dropped (in embodiments where the body 111 is formed of two shell halves and the seam or mating line between the two halves of the body 111 run through the docking bay 120). It may also be noted that the module 150 is recessed into the host device body 111 when it is positioned within the docking bay 120 so as to react with the side loads to ensure that the fixing points of the add-on module (e.g., the fasteners 280, 282 and hook 270) are not unduly stressed when the assembly 100 is dropped or otherwise impacted.

Figure 3:
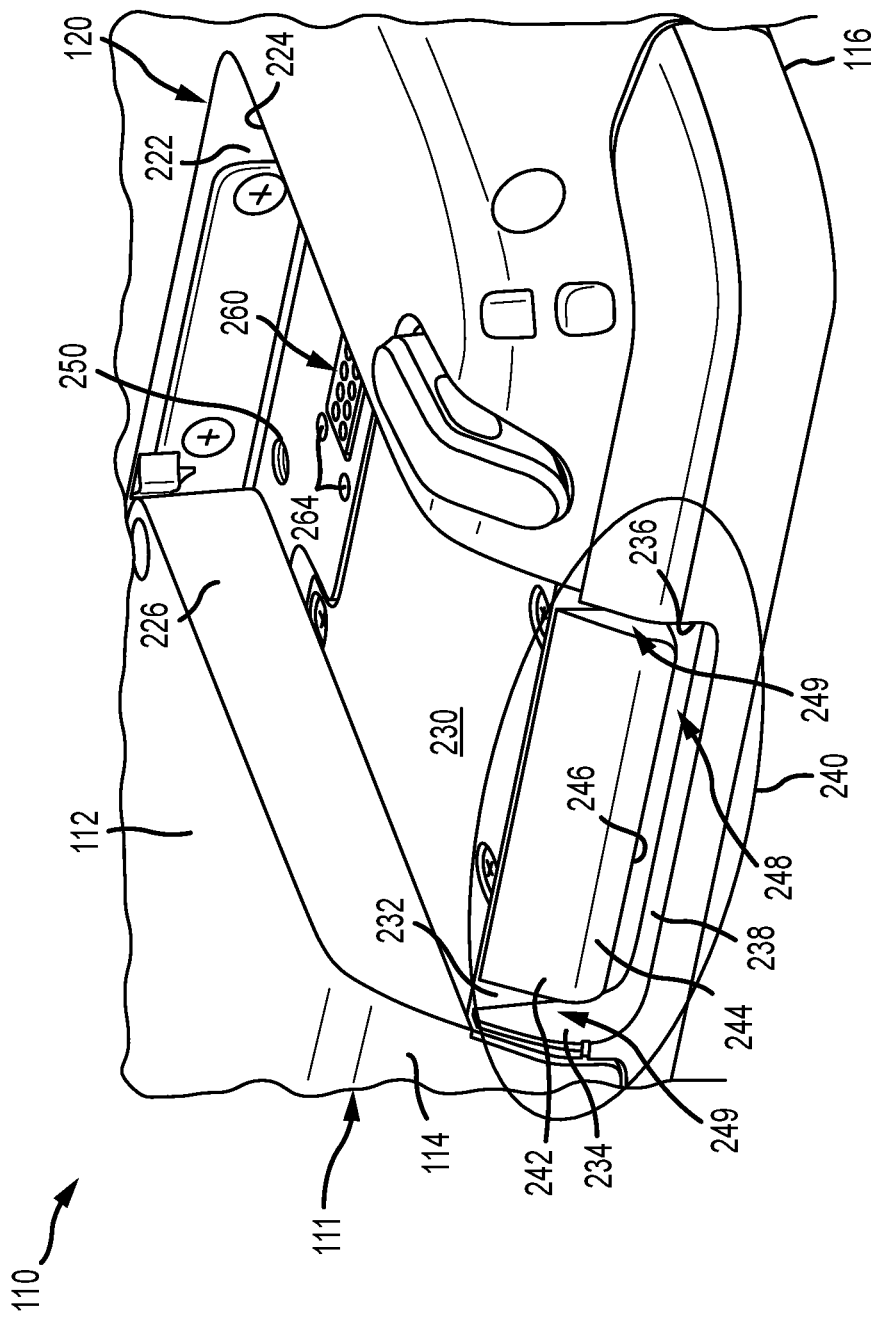
FIG. 3 is a perspective view of the host computing device of FIG. 1 showing the docking bay in more detail including the interface/connection components provided on the hosting device body.

The corresponding feature on the host device 110 can be seen in FIG. 3, which illustrates a perspective view of the docking bay 120 before the add-on module 150 is attached to the host device 110, and this corresponding feature may be thought of as a mating feature, tongue, post, or tab 240 that is received into the recessed surface of the hook 270 to mate with upper side wall or hook member 276. The docking bay 120 includes a set of sidewalls that define a recessed volume or space in the host device body 111 (or on side 112) for receiving the add-on module 150. Specifically, as shown, the docking bay 120 includes a back or inner side wall 222 a distance from the edge 114 and a depth from side 112 of the host device body 111 that establishes a depth of the docking bay 120 and sets a location of the bay's mating or receiving surface 230. Left and right sidewalls 224, 226 extend upward (typically vertically) from the mating/receiving surface 230, and these walls 224, 226 act to restrain a received add-on module 150 from side-to-side movement and cause side loads to be transferred into the body 111 of the host device 110 rather than being borne solely by the add-on module 150 and its fasteners 280, 282. The sidewalls 224, 226 are parallel and are spaced apart a distance that is chosen to be the width of the module body 152 (or a small amount greater to account for manufacturing tolerances and avoid requiring a press fit mating in all instances). At the outer end of the receiving/mating surface 230 a ledge or end wall 232 is provided that steps downward a further distance from the surface 230 (and from side 112 of the host device body 111), and the end wall 232 when combined with left and right side walls 234, 236 and lower lip/guiding outer edge 238 defines a void/space on the side 112 (or in docking bay 120) for the mating feature or tab 240.

The hook mating feature or tab 240 is affixed to (or integrally formed with) the ledge or end wall 232, and its body extends outward from the ledge/end wall 232. The tab 240 has an upper sloped portion 242 extending from the receiving surface 230 down toward the lower lip 238 to a lower portion 244 of the tab 240. The lower portion 244, as shown, has a hook-mating surface 246 that is spaced apart a distance from the lower lip 238 to form a bottom gap 248 in which the upper sidewall or hook member 276 of the hook 270 can be inserted/received. It may also be noted that the hook 270 is created by parts 111 and 116 such that when the module 150 is placed onto the host device 110 the module 150 helps to hold the two parts 111 and 116 together. Also, the body of the tab 240 does not extend to the left and right walls 234, 236 so that there are a pair of end/side gaps 249 in which the sidewalls 272, 274 of the hook 270 can be inserted/received when the add-on module 150 is attached to the host device body 111. When assembled, the upper sidewall or hook member 276 of the hook 270 is positioned in the bottom gap 248, and the hook-mating surface 246 of the tab 240 acts to prevent the add-on module 150 from rotating "upward" or off of the side 112 of the host device body 111 or out of the docking bay 120.

The docking bay 120 includes additional components of the rugged connection/interface. Particularly, a pair of threaded holes/receptacles 250 (and 550 in FIG. 5) are provided on the receiving/mating surface 230 proximate to the inner or end sidewall 222. The holes/receptacles 250 are configured for receiving the fasteners 280, 282 of the add-on module 150. For example, the holes/receptacles 250 are located in the docking bay 120 to receive the fasteners 280, 282 when the hook 270 is coupled with the mating feature or tab 240, and this places the end 158 of the module body 152 against or proximate to the inner or end sidewall 222 of the docking bay 120. The fasteners 280, 282 may be screws and the holes/receptacles 250 have a diameter and are threaded with a pattern to match that of the screws 280, 282. Further, the docking bay 120 includes a set of electrical contacts 260 for mating with the set of connection pins 290 when the module 150 is positioned within the docking bay 120. To provide alignment, the receiving surface 230 further includes a set of guide holes 264 at the corners of the set of contacts 260 for receiving the guide posts 294 on the module body 150. When the fasteners 280, 282 are tightened within the holes 250, the set of pins 290 are pressed against the set of contacts 260, and the sealing member 292 is pressed against (and compressed in some cases) the receiving surface 230 to provide an environmental (or liquid resistant) seal.

Figure 4A:
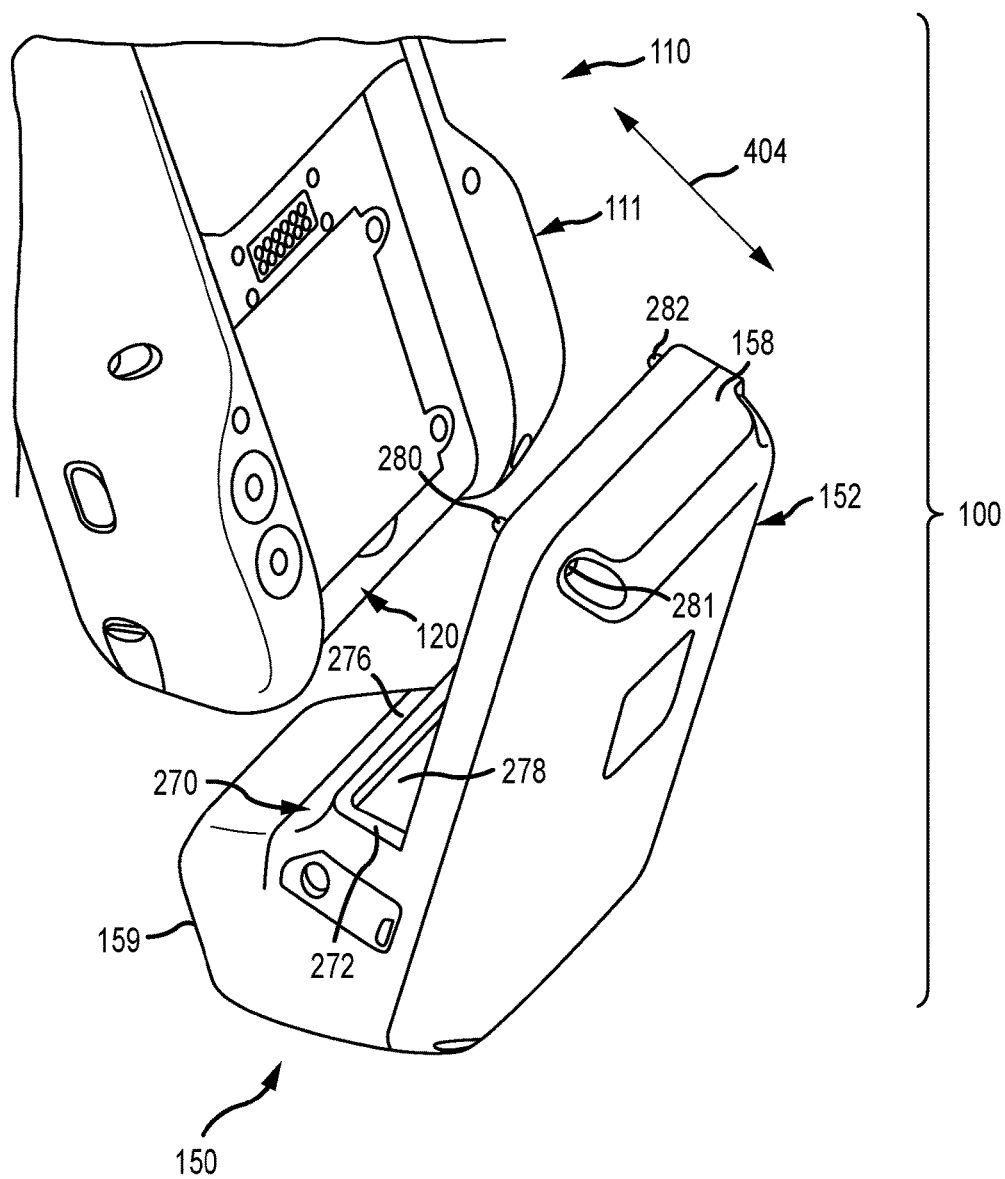
FIGS. 4A and 4B are exploded perspective views of the assembly of FIG. 1 or may be thought of as a view of the assembly FIG. 1 during disassembly or during coupling of the modular accessory to the host device using the interface/connection of the present description.
Figure 4B:
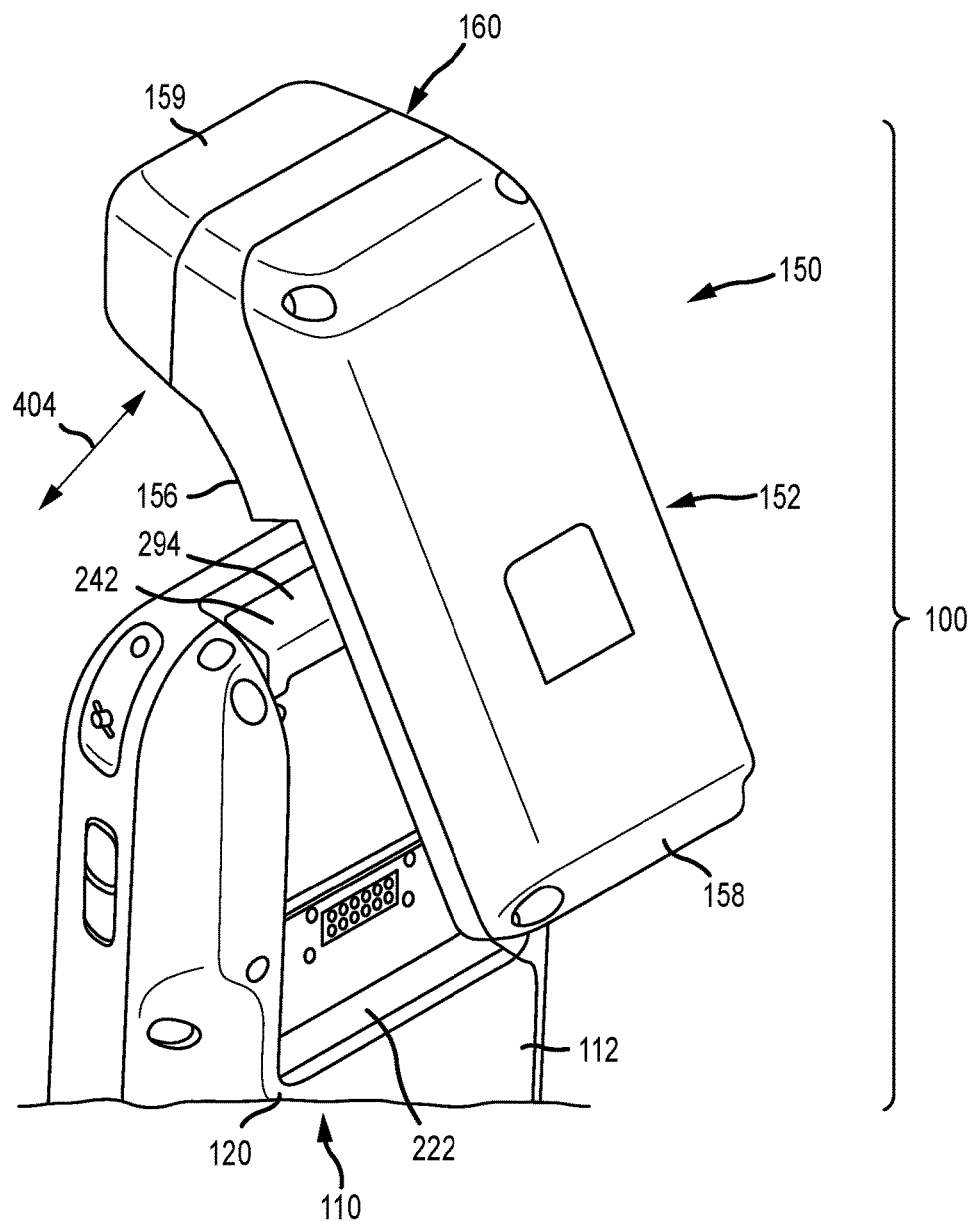

FIGS. 4A and 4B are perspective views showing the assembly 100 as the add-on module 150 is attached (or detached) to the host device body 111. To form the assembly 100 with a rugged connection/interface, the add-on module 150 is positioned with its top or first side 156 facing the docking bay 120 of the host device body 111 and with the end 158 nearer to the end sidewall 222 of the docking bay 120. As shown with arrows 404, the add-on module 150 is then moved into the docking bay 120 with the hook 270 abutting the mating feature/tab 240 or, more specifically, with hook member or upper sidewall 276 inserted into the gap 248. The body 152 of the module 150 may concurrently be slid within the docking bay 120 with the top or first side sliding over or adjacent to the receiving/mating surface 230 of the docking bay 120 until the guide posts 294 are received in guide holes 264 and screws 280, 282 are received in the threaded holes/receptacles 250. At this point, the fasteners 280, 282 can be tightened such as with a screwdriver with its tip inserted into passageways 281, 283. Once the fasteners 280, 282 are tightened, the assembly 100 is formed, and the add-on module 150 is firmly retained within the docking bay 120 (as shown in FIG. 1).

With many of the unique features of the assembly 100 understood, it may be useful at this point in the description to provide an overview of these and other features useful in providing a module-to-host interface. In the example assembly 100 of FIGS. 1-4B, a single docking bay 120 is shown for use in receiving a single add-on module, but other embodiments may include two or three docking bays due to the pinout design used in the set of connection pins 290 and host contacts 260. The electrical connection provided by the pins/contacts provides: (a) a communication interface between the module 120 and the host device (or its controller) (e.g., a Universal Serial Bus (USB) interface such as a USB 3.0 SuperSpeed Interface or the like); (b) a power supply to the add-on module from the host (or vice versa in some cases) such as a +5 V at 1.5 A power supply per module; (c) a host detection line for the host controller to detect presence of an add-on module in the docking bay; and (d) lines providing shared arbitrary communication between modules and the host device. In practice, an application program interface (API) is defined for the host device to allow the module to be configured (with a software application(s)) for module control (by the host controller) and host-to-module communications.

With regard to the communication interface of the rugged connection, the pin/contact connection may include and/or implement standard USB interface pins (e.g., D+, D−, SSRXD−, SSRXD+, SSTXD+, and SSTXD−), and it may provide (e.g., with pogo pins 290 on the module 150) a USB 3.0 SuperSpeed Interface. Further, it may be backwards compatible to high-speed and full-speed USB devices. With regard to the power supply, the host device 110 may be configured to provide 5V at 1.5 A (i.e., 7.5 W) to each module in a docking bay. Current may be limited to 1.5 A per module, with fault line to host. A host device with multiple docking bays (and, therefore, add-on modules) may be adapted to supply a maximum of 3 A to all the modules (again, with fault line to the host device). In some implementations, the host device may provide individual power supply control per add-on module. In these or other implementations, the 5 V supply may stay active during host suspend.

With regard to module detection, the host controller is adapted to detect module insertion and removal from each docking bay. To this end, the module-to-host interface includes a dedicated pin (e.g., an identification (ID) pin) that is pulled low by the add-on module and is pulled high by the host device. The ID pin may have interrupt capability to the host device on state change. With regard to the shared communication I/O, two separate I/O lines may be included to allow for arbitrary communication between the host device and modules or between the modules (e.g., one shared line from the host platform to each of the three docking bays and any received modules and one shared line from the host platform to each of the three docking bays and any received modules). For example, this may involve use of 3V3 bi-directional digital lines that are pulled down (weakly) by the host device, and the host device can be interrupted by transitions on the I/O lines. The host interface to the I/O lines is bidirectional with tri-state capability in some embodiments. With regard to the module API, an API definition may be provided to facilitate programming of applications for the module that will work effectively with the host controller and/or applications running on the host device and/or other modules. The API may be event driven to account for module removal, overcurrent detection, and the like.

Figure 5:
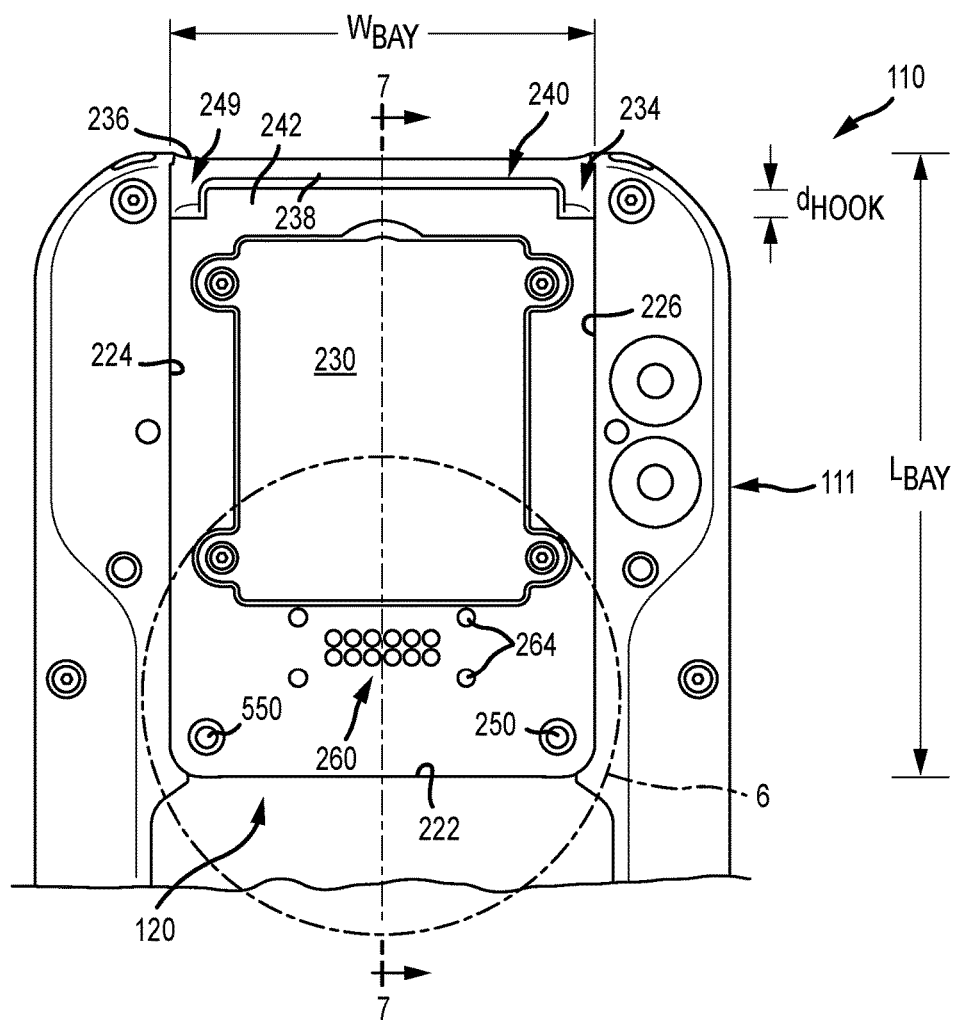
FIG. 5 is a top view of a host device illustrating in greater detail interface/connection elements of the docking bay.

FIG. 5 provides a more detailed view of the rear of a host device 110 that has a docking bay 120 formed in its body 111. As shown, the docking bay 120 has a width, $W_{Bay}$, that is measured as the distance between its right and left sidewalls 224, 226, and the width, $W_{Bay}$, is chosen based on the width of add-on modules such as to be a small amount greater (e.g., 0.1 to 0.5 millimeters (mm) or the like) than the module width ($W_{Module}$ in FIG. 8). FIG. 5 also shows that the docking bay 120 has a length, $L_{Bay}$, which may be measured from the tab 240 to the inner or end sidewall 222 (or from the lip 238 to the end sidewall 222), and the bay length, $L_{Bay}$, is chosen to be as great as practical based on the host device body 111 (e.g., 40 to 80 mm or the like with 60 mm used in some embodiments and to be some amount less than the overall dimensions of the body 111) so as to limit the amount of overhang or cantilevering of the body 152 of the add-on module or, stated differently, to maximize the length of the body 152 that is protected within the docking bay 120 and its sidewalls 224, 226. FIG. 5 also shows that the hook or tab body 240 is configured to extend outward a distance from the receiving surface 230 or to have a depth (which is labeled as $d_{Hook}$ as it is desirable for this depth to be at least as large as depth of hook member 276 shown in FIG. 10), which determines a maximum amount of overlap it can have with a hook member 276 when a module 150 is placed in the docking bay 120. The depth of the tab 240 may for example be in the range of 3 to 10 mm (with a hook depth, $d_{Hook}$, of about 5 mm, for example) to provide a module-to-host device physical coupling to prevent rotation of the end of the module off or out of the docking bay 120.

Figure 6:
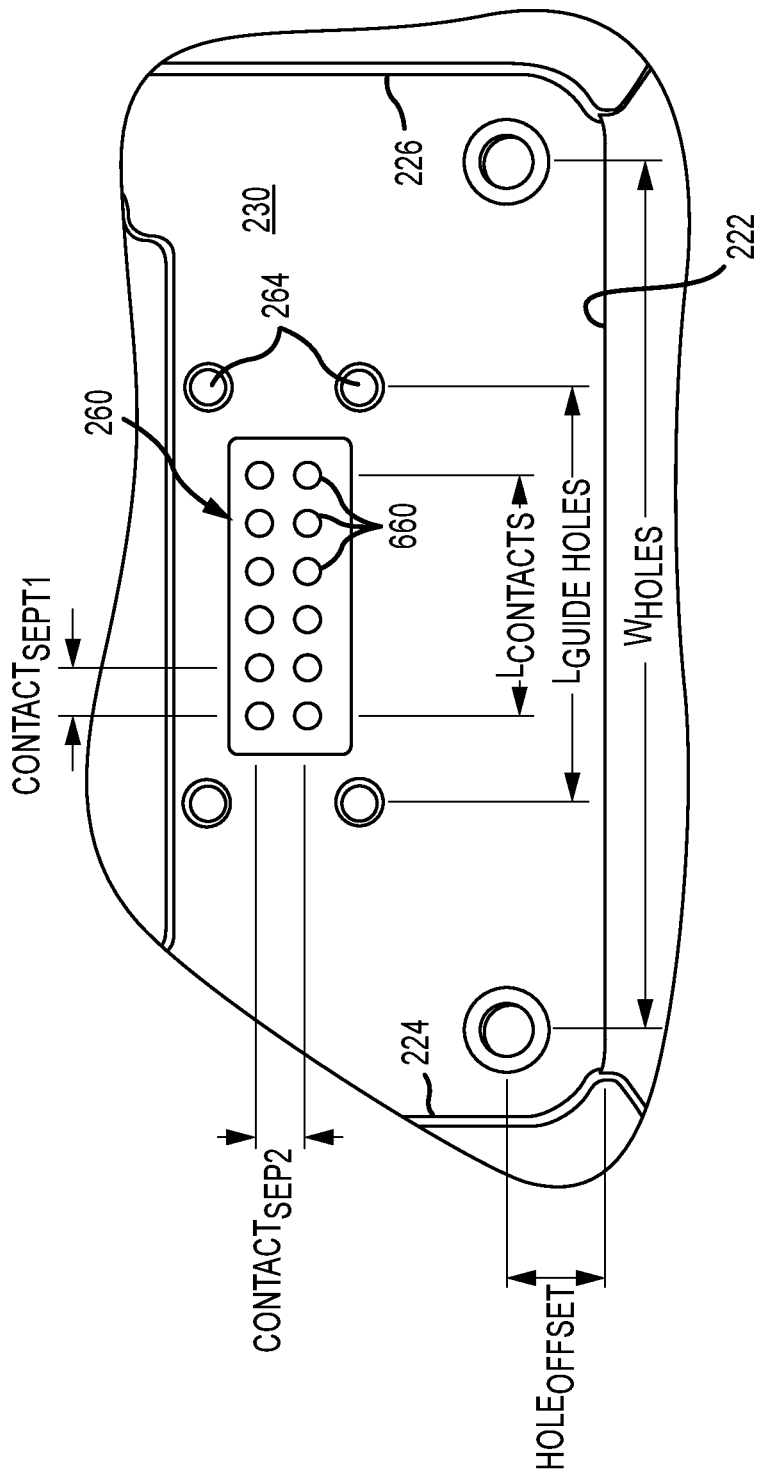
FIG. 6 is an enlarged view, taken from FIG. 5, of the inner end of the docking bay of the host device showing further detail of the interface/connection elements including the host contact set, guide/alignment holes, and threaded holes/receptacles.

FIG. 6 is a more detailed view of the set of host device contacts 260 shown in FIG. 5. Each contact 660 in the set of contacts 260 may have a diameter (e.g., 1 to 2 mm or the like (e.g., to allow 0.54 mm isolation between contacts) with 1.5 mm being useful in some cases), and the set of contacts 260 are arranged in a pattern that corresponds with the pattern of the set of pins 290 on the add-on module 150, e.g., a rectangular pattern with a length, $L_{Contacts}$. For example, the contacts 660 may be arranged in two side-by-side rows with each row containing six contacts 660. The contacts 660 in each row may be separated a distance, $Contact_{Sep1}$, and the rows may be separated another distance, $Contact_{Sep2}$, which may be the same or different (e.g., in the range of 2 to 3 mm with about 2.5 mm being used in one embodiment). The pogo pins of the set of pins 290 would be arranged in an identical pattern with identical spacing.

To achieve proper alignment of the module pins 290 with the set of contacts 260, the guide holes 264 are arranged in a pattern that matches that of the guide posts 294 of the module 150, e.g., with a matching separation length, $L_{Guide\ Holes}$ (and matching separation width not labeled specifically in FIG. 6). Similarly, the threaded holes/receptacles 250, 550 are separated by a predefined distance, $W_{Holes}$, that matches the separation of module fasteners 280, 282, with the holes 250, 550 being provided in a pattern relative to the guide holes 264 that matches that of the screws 280, 282 and guide posts 294.

Figure 7:
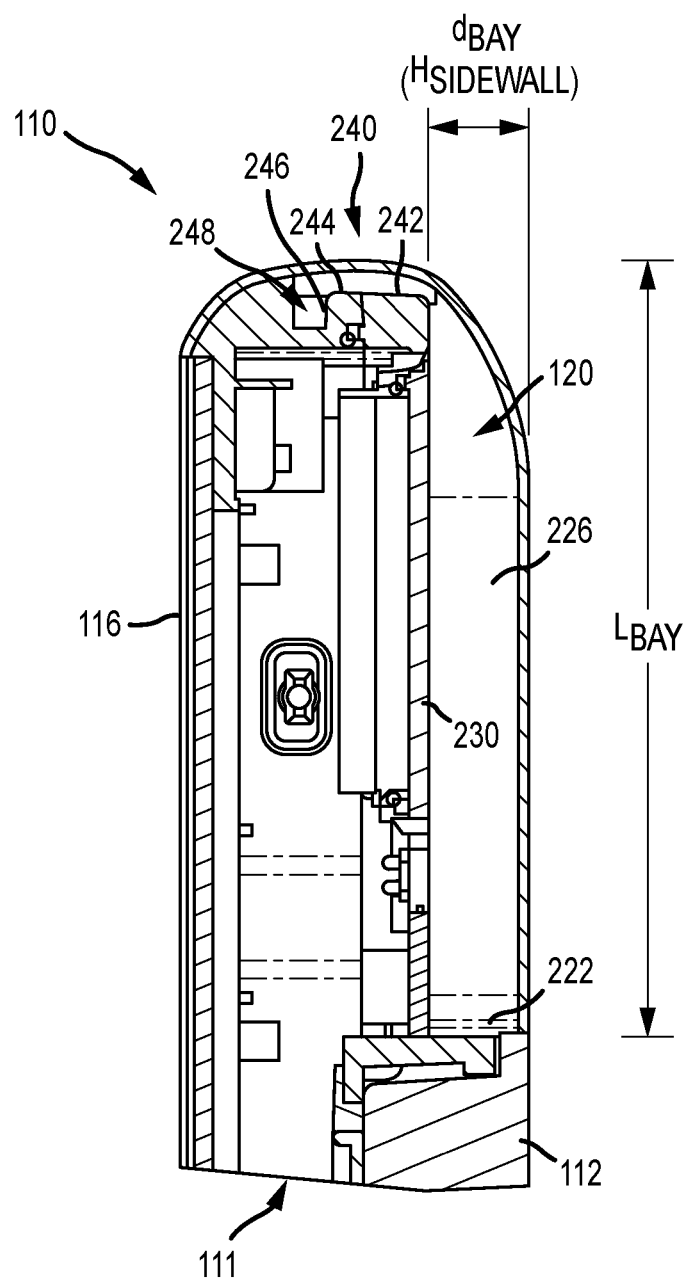
FIG. 7 is a sectional view of the host device of FIG. 5 taken at line 7-7 that shows further design details of the docking bay and the hook-mating elements of the interface/connection elements provided on the host device body.

FIG. 7 is a sectional view taken at line 7-7 in FIG. 6 of the host device body 111 and the docking bay 120. FIG. 7 is useful for illustrating again that the docking bay 120 has a depth, $d_{Bay}$, that is defined by the height, $H_{Sidewall}$, of the right and left sidewalls 224, 226 (which are typically the same). The bay depth, $d_{Bay}$, is preferably chosen to be adequate to allow side loads during dropping to be transferred into the body 111 of the host device 110 via these sidewalls 224, 226 rather than to fasteners 280, 282 on module 150. In some embodiments, the depth, $d_{Bay}$, is chosen to be in the range of 25 to 50 percent (or more) of the height of the module body 152 (e.g., in the range of 5 to 15 mm in some cases with one embodiment using about 10 mm).

As shown in FIG. 6, the contacts 660 of the contact set 260 are arranged in a predefined pattern or pinout to provide a unique electrical/communication interface between a received module and host device. For example, the pinout (and corresponding lines) may be configured as shown in the following table, which includes description of the use of the lines in the modules and host device electrically coupled to these pins/contacts.

TABLE 1

Interface Pinout

| Pin # | Signal Name | Description |
|---|---|---|
| 1 | HS_USB_D+ | High Speed USB 2.0 Data+ |
| 2 | HS_USB_D− | High Speed USB 2.0 Data− |
| 3 | GND | Ground |
| 4 | PWR_IN (VBUS) | +5 V Power into the Module, max 1.5A |
| 5 | SSRX_USB_D− | USB 3.0 SuperSpeed Receive Data − (For USB 2.0 implementation, leave unconnected) |
| 6 | SSTX_USB_D− | USB .3.0 SuperSpeed Transmit Data − (For USB 2.0 implementation, leave unconnected) |
| 7 | SSRX_USB_D+ | USB 3.0 SuperSpeed Receive Data + (For USB 2.0 implementation, leave unconnected) |
| 8 | SSTX_USB_D+ | USB 3.0 SuperSpeed Transmit Data + (For USB 2.0 implementation, leave unconnected) |
| 9 | ID | Module detection ID |
| 10 | GND | Ground |
| 11 | SHARED1 | Shared communication line.. This line is connected between all modules and the host for accessory control or low latency communication. |
| 12 | SHARED2 | Shared communication line.. This line is connected between all modules and the host for accessory control or low latency communication. |

Figure 10:
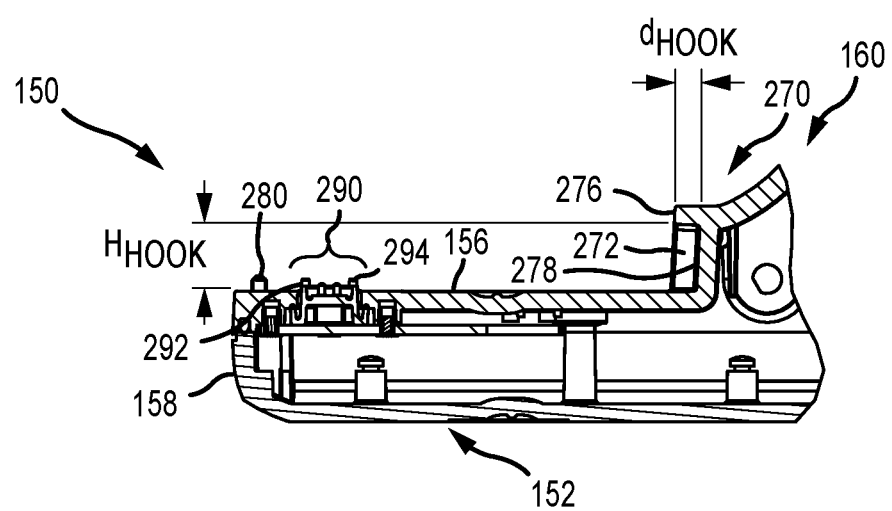
FIG. 10 is a sectional view of the modular accessory of FIG. 8 taken at line 10-10.

FIGS. 8, 9, and 10, with a top view, and end view, and a sectional view, provide further details on an exemplary add-on module 150 of the present description for use with the docking bay 120 and host device 110 of FIGS. 5-7. FIG. 8 shows that the top or first side 156 of the add-on module body 152 has a predefined width, $W_{Module}$, and length, $L_{Module\ Mating\ Surface}$ (as measured from the end 158 to the hook 270). The width, $W_{Module}$, is chosen to match that of the docking bay 120 or, more specifically is chosen to be some amount (e.g., 0.1 to 1 mm or the like) less than the docking bay width, $W_{Bay}$, to allow the module 150 to be inserted into the docking bay 120 so that the module's sides abut or are proximate to the bay sidewalls 224, 226 to pass side loads into the host device body 111. The length, $L_{Module\ Mating\ Surface}$, is chosen to match or substantially match (within manufacturing tolerances) the length, $L_{Bay}$, of the bay 120 so that the hook 270 mates with the mating feature/tab 240 of the docking bay 120 when the fasteners 280, 282 are mated with the threaded receptacles/holes in the docking bay 120 (or when end 158 of the body 152 is against or proximate to the end sidewall 222 of the docking bay 120).

To facilitate alignment of the electrical pins/contacts, the guide posts 294 are arranged in a pattern (about the periphery of the set of contact pins 290) matching that of guide holes 264 such as in a rectangular pattern with a length, $L_{Guide\ Pins}$, that equals the separation, $L_{Guide\ Holes}$, of guide holes 264. Further, the guide pins in set 290 are arranged in two rows in a pattern matching that of contacts 260 such as with the length, $L_{Contacts}$. The fasteners 280, 282 are placed at the corners of top side 156 near end 158 and are spaced apart a distance, $W_{Screws}$, which equals the separation distance, $W_{Holes}$, between the holes/receptacles 250, 550 in the docking bay 120.

FIG. 9 is useful for showing, with an end view, the endwall 278 of the hook 270 that is used to receive and abut (in some embodiments) the body of the tab or mating feature 240 on the host device body 111 (e.g., top and bottom portions 242, 244 shown in FIG. 3 on tab 240). When the tab 240 is abutting or proximate to the endwall 278, the hook member 276 is inserted into (or disposed within) the gap 248 between the tab 240 and lower lip 238, and the hook mating surface 246 of the tab mates with inner surfaces of the hook member 276 to limit module rotation. To allow the tab 240 to be inserted into the hook 270, the sidewalls 272, 274 are spaced apart a distance, $W_{Hook}$, that matches (or is somewhat bigger to account for manufacturing tolerances) the width of the tab 240 (or at least the lower portion 244 and hook mating surface 246), and these relatively equal sizes of mating components are useful for more equally distributing loads (resisting lift-off or rotation of the module 150), but other embodiments may use differently sized components and/or components made up of two, three, or more parts rather than a unitary tab 240 and/or a unitary hook member 276.

FIG. 10 illustrates the add-on module 150 with a sectional view taken at line 10-10 of FIG. 8. As shown, the hook 270 is provided at an inner end of the top side 156 and has a depth, $d_{Hook}$, and height, $H_{Hook}$, that are chosen to facilitate mechanical or physical coupling of the module body 152 with the docking bay 120 of the host device body 111. Particularly, the depth, $d_{Hook}$, may be chosen to ensure adequate overlap with the body of the tab 240 such as 1 to 10 mm of overlap as may be provided by having at least about half of the body of the tab 240 received inside the void/space of the hook 270 defined by sidewalls 272, 274, 276 and 273 (and top side 146) while other embodiments use a depth, $d_{Hook}$, that substantially equals the thickness of the body of the tab 240 (e.g., a depth in the range of 4 to 6 mm with a tab body that extends outward from the end of the receiving/mating surface 230 by a value in this range (such as about 5 mm)). The height, $H_{Hook}$, is chosen to allow the tab body to be received in the void/space of the hook 270, too, and it may be sized to be at least as large as the lower portion 244 of the tab body or, more typically, at least as large as the entire tab body (as measured from receiving/mating surface 230 to the hook mating surface 246 such as in the range of 10 to 20 mm or the like) so that the entire tab body may inserted into or engaged with the hook 270.

The materials used to fabricate the connection components generally are not limiting of the present invention. The connection pins and contacts may be formed of copper or other metals useful for providing electrical connections. The module and host device bodies typically will be formed of a plastic that may be relatively rigid (or non-flexible/compliant) while some components may be formed of a rubber or more compliant plastic.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

We claim:

1. An assembly for providing a rugged interface between a host device and an add-on module, comprising:
   a host device including a host device body with a side including a docking bay, wherein the docking bay includes a receiving surface that is recessed a distance from the side of the host device body to define a depth of the docking bay and wherein the host device includes a hook mating feature with a body protruding outward from the docking bay; and
   an add-on module including a module body with a top side and a bottom side, wherein the module body is positionable within the docking bay with the top side of the module body abutting the receiving surface of the docking bay, wherein the module body includes a hook extending upward from an end of the top side that is adapted to receive the body of the hook mating feature when the module body is positioned within the docking bay to block rotation of the module body out of the docking bay, wherein the module body further comprises at least one fastener with a threaded end extending outward from the top side of the module body, wherein the at least one fastener is provided in a first end of the module body opposite a second end of the module body containing the hook, and wherein the receiving surface of the docking bay includes one or more threaded holes for receiving the threaded end of the at least one fastener when the module body is positioned within the docking bay.

2. The assembly of claim 1, wherein the docking bay further includes an inner sidewall extending from the side of the host device body to the receiving surface, wherein the receiving surface is disposed between the inner sidewall and the hook mating feature, and wherein the module body comprises two of the fasteners and the receiving surface includes two of the threaded holes for receiving the threaded ends of the fasteners when the module body is positioned within the docking bay with the first end of the module body proximate to the inner sidewall of the docking bay.

3. The assembly of claim 1, wherein the hook comprises left and right spaced-apart sidewalls extending outward from the top side of the module body, wherein the hook further comprises an upper sidewall extending between the left and right spaced-apart sidewalls, wherein a void space is defined by inner surfaces of the left and right spaced-apart sidewalls and the upper sidewall, and wherein the body of the hook mating feature is received within the void space with a hook-mating surface of the body abutting the upper sidewall when the module body is positioned within the docking bay to form the rugged interface.

4. The assembly of claim 1, wherein the hook comprises an upper sidewall spaced apart and extending outward from an end of the module body parallel to and toward the top side and wherein a hook-mating surface of the body abuts the upper sidewall when the module body is positioned within the docking bay to form the rugged interface.

5. The assembly of claim 1, wherein a communication interface is formed when the module body is positioned within the docking bay via coupling of a set of connection pins on the top side of the module body and a set of contacts on the receiving surface of the docking bay and wherein a pinout design for the communication interface includes data communication lines and a power supply line for supplying power from the host device to the add-on module.

6. The assembly of claim 5, wherein the set of connection pins comprise a set of pogo pins.

7. The assembly of claim 5, wherein the data communication lines are configured to provide a Universal Serial Bus (USB) connection between the add-on module and the host device.

8. The assembly of claim 5, wherein the pinout design further includes a module detection signal allowing the host device to detect the add-on module in the docking bay and also includes at least one shared communication line connected between the add-on module, any additional add-on modules in additional docking bays on the host device body, and the host device for accessory control or low latency communications.

9. An assembly for providing a rugged interface between a host device and an add-on module, comprising:

a host device including a host device body with a docking bay, wherein the docking bay includes a receiving surface that is recessed a distance from a surface on the host device body, first and second sidewalls extending along opposed edges of the receiving surface, and an inner sidewall extending between ends of the first and second sidewalls, wherein the docking bay has an open end opposite the inner sidewall, and wherein the host device includes a hook mating feature with a body protruding outward from the docking bay proximate to the open end; and a module including a module body with a top side and a bottom side, wherein the module body is positionable within the docking bay with the top side of the module body abutting the receiving surface of the docking bay, wherein the module body has a height that is less than about one half a height of the first and second sidewalls, wherein the module body includes a hook element extending upward from an end of the top side that is adapted to receive the body of the hook mating feature when the module body is positioned within the docking bay, wherein the module body further comprises at least one fastener with a threaded end extending outward from the top side of the module body, and wherein the receiving surface of the docking bay includes one or more threaded holes for receiving the threaded end of the at least one fastener when the module body is positioned within the docking bay.

10. The assembly of claim 9, wherein the hook element comprises left and right sidewalls extending outward from the top side of the module body, wherein the hook element further comprises an upper sidewall extending between the left and right sidewalls, wherein a void space is defined by inner surfaces of the left and right sidewalls and the upper sidewall, and wherein the body of the hook mating feature is received within the void space with a hook-mating surface of the body of the hook mating feature abutting the upper sidewall when the module body is positioned within the docking bay.

11. The assembly of claim 9, wherein a communication interface is formed when the module body is positioned within the docking bay via coupling of a set of connection pins on the top side of the module body and a set of contacts on the receiving surface of the docking bay and wherein a pinout design for the communication interface includes data communication lines and wherein the set of connection pins comprise a set of pogo pins.

12. The assembly of claim 11, wherein the data communication lines are configured to provide a Universal Serial Bus (USB) connection between the add-on module and the host device.

13. The assembly of claim 11, wherein the pinout design further includes a power supply line, a module detection signal allowing the host device to detect the add-on module in the docking bay, and at least one shared communication line connected between the add-on module, any additional add-on modules in additional docking bays on the host device body, and the host device for accessory control or low latency communications.

14. An assembly for providing a rugged interface between a host device and an add-on module, comprising:

a host device including a host device body with a docking bay, wherein the docking bay includes a receiving surface recessed a distance from the side of the host device body to define a depth of the docking bay and wherein the host device includes a tab protruding outward from the docking bay; and a module including a module body with a top side and a bottom side, wherein the module body is positionable within the docking bay with the top side of the module body abutting the receiving surface of the docking bay, wherein a communication interface is formed, when the module body is positioned within the docking bay, via coupling of a set of connection pins on the top side of the module body to a set of contacts on the receiving surface of the docking bay, wherein a pinout design for the communication interface includes data communication lines and a power supply line for supplying power from the host device to the add-on module, and wherein the set of connection pins comprises a plurality of pogo pins.

15. The assembly of claim 14, wherein the data communication lines are configured to provide a Universal Serial Bus (USB) connection between the module and the host device.

16. The assembly of claim 14, wherein the pinout design further includes a module detection signal allowing the host device to detect the module in the docking bay and also includes at least one shared communication line connected between the module, any additional add-on modules in additional docking bays on the host device body, and the host device for accessory control or low latency communications.

17. The assembly of claim 14, wherein the module body includes a hook extending upward from an end of the top side that is adapted to receive the body of the hook mating feature when the module body is positioned within the docking bay to block rotation of the module body out of the docking bay, and wherein the module body has a height as measured between the top side to the bottom side and the depth of the docking bay is at least one fourth of the height of the module body.

18. The assembly of claim 17, wherein the module body further comprises at least one fastener with a threaded end extending outward from the top side of the module body, wherein the at least one fastener is provided in a first end of the module body opposite a second end of the module body containing the hook, and wherein the receiving surface of the docking bay includes one or more threaded holes for receiving the threaded end of the at least one fastener when the module body is positioned within the docking bay.

19. The assembly of claim 18, wherein the docking bay further includes an inner sidewall extending from the side of the host device body to the receiving surface, wherein the receiving surface is disposed between the inner sidewall and the hook mating feature, and wherein the module body comprises two of the fasteners and the receiving surface includes two of the threaded holes for receiving the threaded ends of the fasteners when the module body is positioned within the docking bay with the first end of the module body proximate to the inner sidewall of the docking bay.

20. An assembly for providing a rugged interface between a host device and an add-on module, comprising:

a host device including a host device body with a side including a docking bay, wherein the docking bay includes a receiving surface that is recessed a distance from the side of the host device body to define a depth of the docking bay and wherein the host device includes a hook mating feature with a body protruding outward from the docking bay; and an add-on module including a module body with a top side and a bottom side, wherein the module body is positionable within the docking bay with the top side of the module body abutting the receiving surface of the docking bay, wherein the module body includes a hook extending upward from an end of the top side that is adapted to receive the body of the hook mating feature when the module body is positioned within the docking bay to block rotation of the module body out of the docking bay, wherein the hook comprises left and right spaced-apart sidewalls extending outward from the top side of the module body, wherein the hook further comprises an upper sidewall extending between the left and right spaced-apart sidewalls, wherein a void space is defined by inner surfaces of the left and right spaced-apart sidewalls and the upper sidewall, and wherein the body of the hook mating feature is received within the void space with a hook-mating surface of the body abutting the upper sidewall when the module body is positioned within the docking bay to form the rugged interface.

21. The assembly of claim 20, wherein the hook comprises an upper sidewall spaced apart and extending outward from an end of the module body parallel to and toward the top side and wherein a hook-mating surface of the body abuts the upper sidewall when the module body is positioned within the docking bay to form the rugged interface.

22. The assembly of claim 20, wherein a communication interface is formed when the module body is positioned within the docking bay via coupling of a set of connection pins on the top side of the module body and a set of contacts on the receiving surface of the docking bay and wherein a pinout design for the communication interface includes data communication lines and a power supply line for supplying power from the host device to the add-on module.

23. The assembly of claim 22, wherein the set of connection pins comprise a set of pogo pins.

24. The assembly of claim 22, wherein the data communication lines are configured to provide a Universal Serial Bus (USB) connection between the add-on module and the host device.

25. The assembly of claim 22, wherein the pinout design further includes a module detection signal allowing the host device to detect the add-on module in the docking bay and also includes at least one shared communication line connected between the add-on module, any additional add-on modules in additional docking bays on the host device body, and the host device for accessory control or low latency communications.

26. An assembly for providing a rugged interface between a host device and an add-on module, comprising:

a host device including a host device body with a side including a docking bay, wherein the docking bay includes a receiving surface that is recessed a distance from the side of the host device body to define a depth of the docking bay and wherein the host device includes a hook mating feature with a body protruding outward from the docking bay; and an add-on module including a module body with a top side and a bottom side, wherein the module body is positionable within the docking bay with the top side of the module body abutting the receiving surface of the docking bay, wherein the module body includes a hook extending upward from an end of the top side that is adapted to receive the body of the hook mating feature when the module body is positioned within the docking bay to block rotation of the module body out of the docking bay, wherein the hook comprises an upper sidewall spaced apart and extending outward from an end of the module body parallel to and toward the top side, and wherein a hook-mating surface of the body abuts the upper sidewall when the module body is positioned within the docking bay to form the rugged interface.

27. The assembly of claim 26, wherein a communication interface is formed when the module body is positioned within the docking bay via coupling of a set of connection pins on the top side of the module body and a set of contacts on the receiving surface of the docking bay and wherein a pinout design for the communication interface includes data communication lines and a power supply line for supplying power from the host device to the add-on module.

28. The assembly of claim 27, wherein the set of connection pins comprise a set of pogo pins.

29. The assembly of claim 27, wherein the data communication lines are configured to provide a Universal Serial Bus (USB) connection between the add-on module and the host device.

30. The assembly of claim 27, wherein the pinout design further includes a module detection signal allowing the host device to detect the add-on module in the docking bay and also includes at least one shared communication line connected between the add-on module, any additional add-on modules in additional docking bays on the host device body, and the host device for accessory control or low latency communications.

31. An assembly for providing a rugged interface between a host device and an add-on module, comprising:

a host device including a host device body with a side including a docking bay, wherein the docking bay includes a receiving surface that is recessed a distance from the side of the host device body to define a depth of the docking bay and wherein the host device includes a hook mating feature with a body protruding outward from the docking bay; and an add-on module including a module body with a top side and a bottom side, wherein the module body is positionable within the docking bay with the top side of the module body abutting the receiving surface of the docking bay, wherein the module body includes a hook extending upward from an end of the top side that is adapted to receive the body of the hook mating feature when the module body is positioned within the docking bay to block rotation of the module body out of the docking bay, wherein a communication interface is formed when the module body is positioned within the docking bay via coupling of a set of connection pins on the top side of the module body and a set of contacts on the receiving surface of the docking bay, wherein a pinout design for the communication interface includes data communication lines and a power supply line for supplying power from the host device to the add-on module, and wherein the set of connection pins comprise a set of pogo pins.

32. The assembly of claim 31, wherein the data communication lines are configured to provide a Universal Serial Bus (USB) connection between the add-on module and the host device.

33. The assembly of claim 31, wherein the pinout design further includes a module detection signal allowing the host device to detect the add-on module in the docking bay and also includes at least one shared communication line connected between the add-on module, any additional add-on modules in additional docking bays on the host device body, and the host device for accessory control or low latency communications.

* * * * *